US012811418B2

(12) United States Patent
Jung et al.

(10) Patent No.: US 12,811,418 B2
(45) Date of Patent: Nov. 24, 2026

(54) APPARATUS FOR AND METHOD OF DETECTING AN ERROR IN A COUPLING BETWEEN CHARGING DEVICES

(71) Applicants: HYUNDAI MOTOR COMPANY, Seoul (KR); KIA CORPORATION, Seoul (KR); YURA CORPORATION CO., LTD., Seongnam-si (KR)

(72) Inventors: Yun Jae Jung, Suwon-si (KR); Do Kyeong Lee, Gwangju-si (KR); Sae Ki Kang, Gunpo-si (KR); Woo Gwon Shim, Seongnam-si (KR); Dae Hwan Kwon, Seongnam-si (KR)

(73) Assignees: HYUNDAI MOTOR COMPANY, Seoul (KR); KIA CORPORATION, Seoul (KR); YURA CORPORATION CO., LTD., Seongnam-si (KR)

( * ) Notice: Subject to any disclaimer, the term of this patent is extended or adjusted under 35 U.S.C. 154(b) by 859 days.

(21) Appl. No.: 17/893,952

(22) Filed: Aug. 23, 2022

(65) Prior Publication Data

US 2023/0135816 A1 May 4, 2023

(30) Foreign Application Priority Data

Nov. 2, 2021 (KR) ........................ 10-2021-0149236

(51) Int. Cl.
*H02J 7/60* (2026.01)
*B60L 53/16* (2019.01)
(Continued)

(52) U.S. Cl.
CPC ................ *H02J 7/60* (2026.01); *B60L 53/16* (2019.02); *B60L 53/62* (2019.02); *G01R 31/364* (2019.01); *G01R 31/68* (2020.01); *G01R 31/69* (2020.01)

(58) Field of Classification Search
None
See application file for complete search history.

(56) References Cited

U.S. PATENT DOCUMENTS 5,506,490 A 4/1996 Demuro
9,321,362 B2 4/2016 Woo et al.
(Continued)

FOREIGN PATENT DOCUMENTS

CN 111993943 A * 11/2020 .............. B60L 53/16
CN 112373320 A * 2/2021 .............. B60L 53/14
(Continued)

OTHER PUBLICATIONS

Office action cited in German application No. 102022209263.5; Mar. 12, 2026; 12 pp.
(Continued)

*Primary Examiner* — Julian D Huffman
*Assistant Examiner* — John P Ondrasik
(74) *Attorney, Agent, or Firm* — Lempia Summerfield Katz LLC

(57) ABSTRACT

The present disclosure proposes an apparatus for detecting an error in a coupling between charging devices and a method of detecting an error in a coupling between charging devices. The apparatus includes a voltage generation unit generating voltages that correspond to resistance values, respectively, of a plurality of charging devices that are hooked up to a connector; a comparison unit comparing magnitudes of voltage values of the generated voltages; and a control unit performing control in such a manner that, among the plurality of charging devices, a charging device preset to be matched based on results of comparing the magnitudes of the voltage values is operated only when hooked up to the connector.

15 Claims, 8 Drawing Sheets

(51) Int. Cl.

| | |
|---|---|
| ***B60L 53/62*** | (2019.01) |
| ***G01R 31/364*** | (2019.01) |
| ***G01R 31/68*** | (2020.01) |
| ***G01R 31/69*** | (2020.01) |

(56) References Cited

U.S. PATENT DOCUMENTS

| | | | | |
|---|---|---|---|---|
| 9,701,210 | B2 | 7/2017 | Woo et al. | |
| 11,299,058 | B2 | 4/2022 | Enthaler et al. | |
| 12,240,344 | B2 | 3/2025 | Huang et al. | |
| 2015/0217654 | A1 | 8/2015 | Woo et al. | |
| 2015/0288201 | A1* | 10/2015 | Hatakeyama | H02J 7/0029 320/107 |
| 2016/0200206 | A1 | 7/2016 | Woo et al. | |
| 2018/0091191 | A1* | 3/2018 | Berger | B60L 53/68 |
| 2018/0208066 | A1* | 7/2018 | Rao | B60L 3/00 |
| 2019/0308521 | A1 | 10/2019 | Enthaler et al. | |
| 2020/0238841 | A1* | 7/2020 | Zaki | B60L 53/60 |
| 2021/0008994 | A1* | 1/2021 | Choi | B60L 53/62 |
| 2021/0184478 | A1* | 6/2021 | Jung | H02J 7/00712 |
| 2022/0194249 | A1* | 6/2022 | Lee | B60L 55/00 |
| 2022/0289051 | A1* | 9/2022 | Huang | H01R 13/70 |

FOREIGN PATENT DOCUMENTS

| | | | | |
|---|---|---|---|---|
| DE | 102011106335 | A1 | 1/2013 | |
| DE | 202015104720 | U1 | 1/2016 | |
| DE | 102016214050 | A1 | 2/2018 | |
| DE | 102013007330 | B4 | 11/2019 | |
| KR | 0171253 | B1 | 5/1999 | |
| KR | 101952159 | B1 | 2/2019 | |
| WO | WO-2012117192 | A1 * | 9/2012 | B60L 53/65 |
| WO | 2021018254 | A1 | 2/2021 | |

OTHER PUBLICATIONS

Office Action cited in Korean application No. 10-2021-0149236; Jun. 24, 2025; 12 pp.

* cited by examiner

APPARATUS FOR AND METHOD OF DETECTING AN ERROR IN A COUPLING BETWEEN CHARGING DEVICES

CROSS REFERENCE TO RELATED APPLICATION

The present application claims priority to Korean Patent Application No. 10-2021-0149236, filed Nov. 2, 2021, the entire contents of which are incorporated herein for all purposes by this reference.

BACKGROUND

Field

The present disclosure relates to an apparatus for and a method of detecting an error in a coupling between charging devices. More particularly, the apparatus for and the method of detecting an error in a coupling between charging devices may check, through the use of a comparison unit in a charging system, whether each charging device necessary for each of two modes is properly coupled (this case is hereinafter referred to "correct coupling") or improperly coupled (this case is hereinafter referred to "erroneous coupling"). Thus, the apparatus for and the method may control operation of an in-cable control box (ICCB). In the charging system, a vehicle battery is charged by coupling charging devices including a plug, the ICCB, a charging system gun, and an outlet according to the two modes for charging using an alternating current power source. Thus, an electric risk of accident that possibly occurs when performing coupling between the charging devices can be prevented.

Description of the Related Art

Electric vehicles or plug-in hybrid vehicles (PHV) are equipped with a battery storing electric power that is supplied to a motor thereof. Systems for charging the battery are broadly categorized into a mode-2 charging system and a mode-3 charging system. The mode-2 charging system charges a battery within a vehicle using a household electric power source. The mode-3 charging system charges the battery within the vehicle using an electric vehicle charging station.

Environment-friendly vehicles (including electric vehicles, plug-in hybrid electric vehicles, and the like) that use an electric motor as a driving source are equipped with a battery for driving a motor. Usually, the battery is charged using a wired plug-in charging method.

In order to charge a battery within the vehicle using the plug-in method, the vehicle is equipped with an inlet plug into which an outlet plug of an external charger is inserted and a locking device.

In addition, a user who desires to use a service for charging the battery places two cables suitable for the mode-2 and the mode-3 charging system within the vehicle in order to use the mode-2 and the mode-3 charging system. The use of the two cables causes inconvenience to the user.

The foregoing is intended merely to aid in understanding the background of the present disclosure and therefore should not be interpreted to admit that the present disclosure falls within the purview of the related art that is already known to a person of ordinary skill in the art.

SUMMARY

The present disclosure is proposed to solve the problems to provide an apparatus for and a method of detecting an error in a coupling between charging devices. The apparatus and the method may check, through the use of a comparison unit in a charging system, whether each charging device necessary for each of two modes is properly coupled (this case is hereinafter referred to "correct coupling") or improperly coupled (this case is hereinafter referred to "erroneous coupling"). Thus, the apparatus for and the method may control operation of an in-cable control box (ICCB). In the charging system, a vehicle battery is charged by performing a coupling between the charging devices including a plug, the ICCB, a charging system gun, and an outlet according to the two modes for charging using an alternating current power source. Thus, an electric risk of accident that possibly occurs when performing a coupling between the charging devices can be prevented.

According to an aspect of the present disclosure, an apparatus for detecting an error in a coupling between charging devices includes a voltage generation unit generating voltages that correspond to resistance values, respectively, of a plurality of charging devices that are hooked up to a connector. The apparatus for detecting the error in the coupling between charging devices also includes a comparison unit comparing magnitudes of voltage values of the generated voltages. The apparatus for detecting the error in the coupling between charging devices also includes a control unit performing control in such a manner that, among the plurality of charging devices, a charging device preset to be matched based on results of comparing the magnitudes of the voltage values is operated only when hooked up to the connector.

In the apparatus, the plurality of charging devices may include a plug connected to an alternating current power source; a charging station gun; and an outlet hooked up to the charging device connected to an electric power source. The outlet is also connected to an inlet on a vehicle in which a battery to be charged is mounted.

In the apparatus, the control unit may control the charging device in such a manner as to be operated. Then, the control unit may control the electric power source based on a control pilot (CP) signal for starting transmission of electric power of the electric power source, interrupting the transmission of the electric power of the electric power source, or controlling an amount of the electric power transmitted from the electric power source.

In the apparatus, the CP signal may be a pulse width modulation (PWM) signal, and the control unit may compute a maximum duty of the CP signal based on a voltage value of a voltage corresponding to a resistance value of the plug that is connected to the alternating current power source.

In the apparatus, a first voltage corresponding to a resistance value of the outlet may be higher than a second voltage corresponding to a resistance value of the plug, and a third voltage corresponding to a resistance value of the charging station gun may be higher than the first voltage.

In the apparatus, a resistance value of the outlet may be within a first resistance section. A resistance value of the plug may be a resistance value within a second resistance section that is higher than all resistance values within the first resistance section. A resistance value of the charging station gun may be a resistance value within a third resistance section that is higher than all resistance values within the second resistance section.

In the apparatus, the connector may include a first hook-up unit hooked up to the plug and a second hook-up unit hooked up to the outlet, wherein the first hook-up unit and the second hook-up unit may be marked with different colors.

In the apparatus, the comparison unit may be a comparator that outputs an output voltage having a non-zero value in a case where a value of a first voltage to be input into a "−" (negative) terminal is lower than a value of a second voltage to be input into a "+" (positive) terminal. The comparison unit may also be a comparator that outputs an output voltage having a zero value in a case where the value of the first voltage is equal to or higher than the value of the second voltage.

In the apparatus, the control unit may perform control in such a manner that the charging device preset to be matched based on the output voltage is operated only when hooked up to the connector.

According to another aspect of the present disclosure, a method of detecting an error in a coupling between charging devices includes generating, by a voltage generation unit, voltages that correspond to resistance values, respectively, of a plurality of charging devices that are hooked up to a connector. The method of detecting the error in the coupling between charging devices also includes comparing, by a comparison unit, magnitudes of voltage values of the generated voltages. The method of detecting the error in the coupling between charging devices also includes performing, by a control unit, control in such a manner that, among the plurality of charging devices, a charging device preset to be matched based on results of the comparison is operated only when hooked up to the connector.

In the method, in the generating of the voltages, the plurality of charging devices may include a plug connected to an alternating current power source, a charging station gun, and an outlet hooked up to the charging device connected to an electric power source. The outlet is also connected to an inlet on a vehicle in which a battery to be charged is mounted.

In the method, in the generating of the voltages, a first voltage corresponding to a resistance value of the outlet may be higher than a second voltage corresponding to a resistance value of the plug, and a third voltage corresponding to a resistance value of the charging station gun may be higher than the first voltage.

In the method, in the generating of the voltages, a resistance value of the outlet may be within a first resistance section, a resistance value of the plug may be a resistance value within a second resistance section that is higher than all resistance values within the first resistance section, and a resistance value of the charging station gun may be a resistance value within a third resistance section that is higher than all resistance values within the second resistance section.

In the method, in the comparing of the magnitudes of the voltage values, the comparison unit may output an output voltage having a non-zero value in a case where a value of a first voltage to be input into a "−" (negative) terminal is lower than a value of a second voltage to be input into a "+" (positive) terminal, and may output an output voltage having a zero value in a case where the value of the first voltage is equal to or higher than the value of the second voltage.

In the method, in the performing of the control, the control unit may perform control in such a manner that, among the plurality of charging devices, a charging device matched based on the output voltages is operated only when hooked up to the connector.

The apparatus for and the method of detecting an error in a coupling between charging devices according to the present disclosure are capable of checking, through the use of a comparison unit in a charging system, whether each charging device necessary for each of two modes is properly coupled (this case is hereinafter referred to "correct coupling") or improperly coupled (this case is hereinafter referred to "erroneous coupling") and thus of controlling operation of an in-cable control box (ICCB). In the charging system, a vehicle battery is charged by performing a coupling between the charging devices including a plug, the ICCB, a charging system gun, and an outlet according to the two modes for charging using an alternating current power source. Thus, an electric risk of accident that possibly occurs when performing a coupling between the charging devices can be prevented.

DETAILED DESCRIPTION

Embodiments of the present disclosure are described below in terms of specific structures and functions for illustrative purpose to provide an enabling disclosure of the present disclosure. The embodiments of the present disclosure may be practiced in various ways, and the present disclosure should not be construed as being limited thereto. In addition, the same or similar constituent element is given the same or similar reference number, and a description thereof is not repeated. In addition, in describing the embodiments of the present disclosure, a detailed description of well-known technology related thereto has been omitted when determined as making the nature and gist of the present disclosure unclear.

A noun in a singular form has the same meaning as a noun in a plural form unless a noun in a singular form and a noun in a plural form have different meanings in context. The terms "include," "have," and the like that are used throughout the present specification are each intended to indicate that a feature, a section, a number, a step, an operation, a constituent element, a component, or a combination of these is present without precluding the possible presence or addition of one or more other features, sections, numbers, steps, operations, constituent elements, components, or combinations of these. The embodiments of the present disclosure are described in detail below with reference to the accompanying drawings. When a component, device, element, or the like of the present disclosure is described as having a purpose or performing an operation, function, or the like, the component, device, or element should be considered herein as being “configured to” meet that purpose or to perform that operation or function. The present disclosure describes various components of an apparatus for detecting an error in a coupling between charging devices as units, such as: a voltage generation unit, a comparison unit, a control unit, a first hook-up unit, and a second hook-up unit. Each of these units may separately embody or be included with a processor and a memory, such as a non-transitory computer readable media, as part of the apparatus.

A plug varies in type from one country to another (there are approximately 19 types of plugs), and a maximum charging electric-current value of a household electric power source also varies from one country to another. According to the present disclosure, types of plugs connectable to an in-cable control box (ICCB) are set to have their respective specific resistances. When a plug is connected to the ICCB, preset suitable charging electric current is determined based on the specific resistance of the connected plug. Then, a charging electric-current value is set. Therefore, the present disclosure provides the advantage of controlling charging by universally setting the charging electric-current value through the use of one ICCB, without exceeding the maximum charging electric-current values in many countries.

Figure 1:
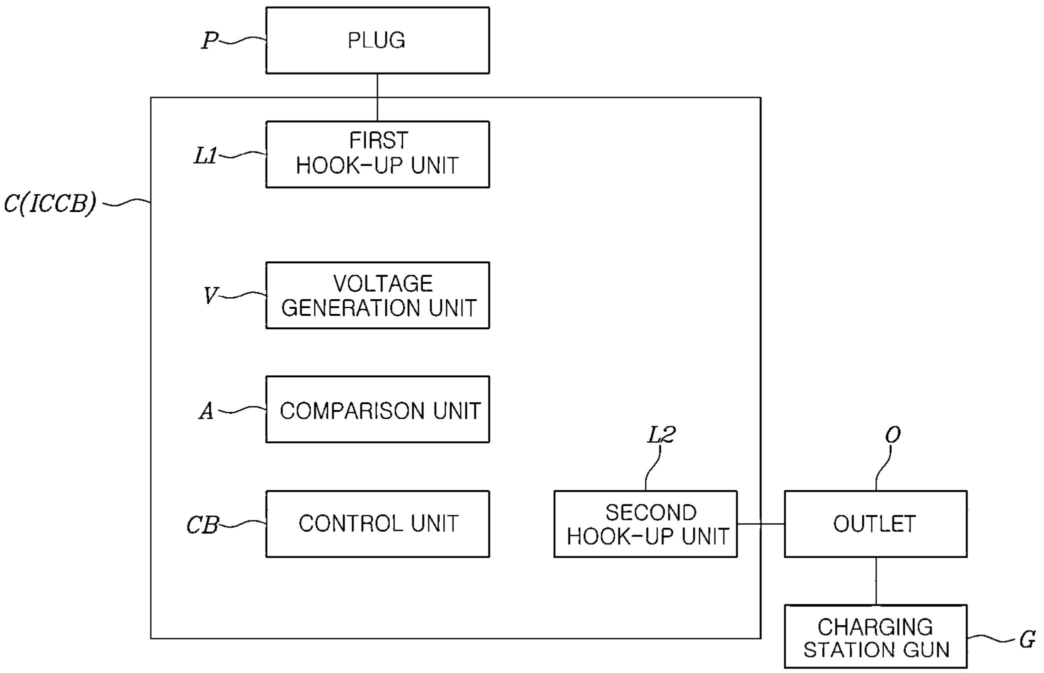
FIG. 1 is a block diagram illustrating a configuration of an apparatus for detecting an error in a coupling between charging devices according to an embodiment of the present disclosure.

FIG. 1 is a block diagram illustrating a configuration of an apparatus for detecting an error in a coupling between charging devices according to an embodiment of the present disclosure. The apparatus for detecting an error in a coupling between charging devices according to the present disclosure may include a voltage generation unit V, a comparison unit A, and a control unit CB. The voltage generation unit V generates voltages that correspond to resistance values, respectively, of a plurality of charging devices that are hooked up to a connector C. The comparison unit A compares magnitudes of voltage values of the generated voltages. The control unit CB performs control in such a manner that, among the plurality of charging devices, a charging device preset to be matched based on results of comparing the magnitudes of the voltage values is operated only when hooked up to the connector C. The plurality of charging devices include a plug P, a charging station gun G, and an outlet O. The plug P is connected to an alternating current power source. The outlet O is hooked up to a charging device connected to an electric power source and is connected to an inlet on a vehicle in which a battery to be charged is mounted. The connector C includes a first hook-up unit L1 and a second hook-up unit L2. The first hook-up unit L1 is hooked up to the plug P, and the second hook-up unit L2 is hooked up to the outlet O.

Figure 2:
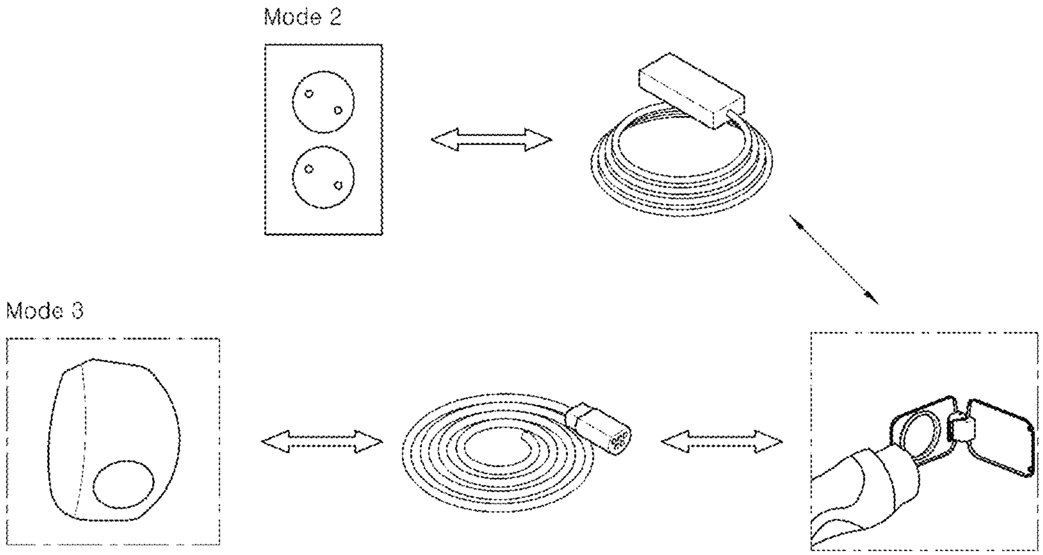
FIG. 2 is a view illustrating that an individual charging cable is used according to each charging mode in the related art.

FIG. 2 is a view illustrating that an individual charging cable is used according to each charging mode in the related art. Systems for charging a battery within a vehicle are broadly categorized into a mode-2 charging system and a mode-3 charging system. The mode-2 charging system charges a battery within a vehicle using a household electric power source. The mode-3 charging system charges the battery within the vehicle using an electric vehicle charging station. In the related art, a dedicated individual charging cable is used according to each charging mode. Therefore, there is a problem in that a user prepares two cables together.

Figure 3:
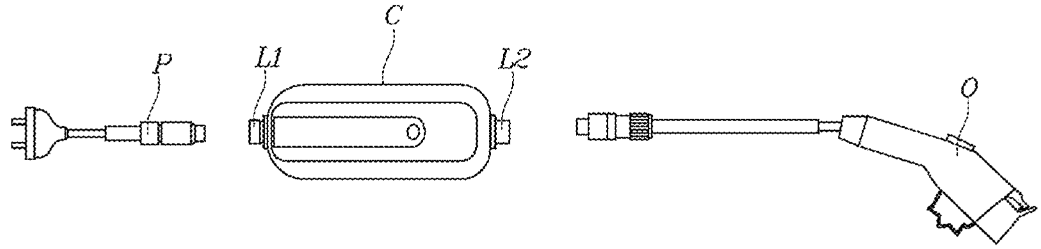
FIGS. 3-6 are views each illustrating a state where the charging apparatuses according to the present disclosure are coupled to each other according to a charging mode.
Figure 4:
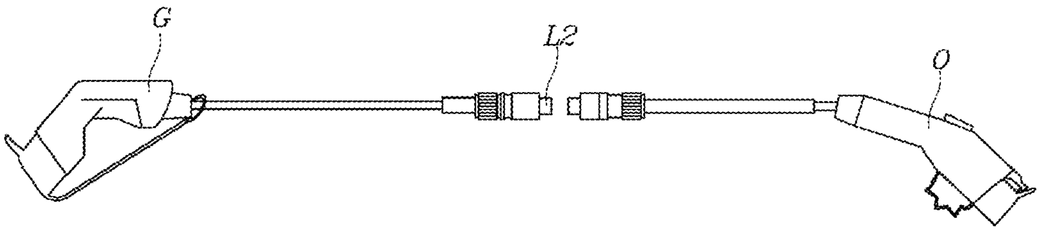
Figure 5:
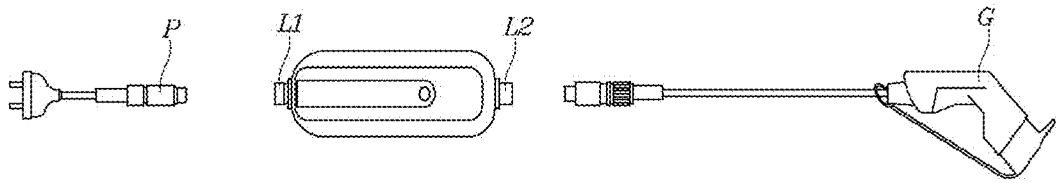
Figure 6:
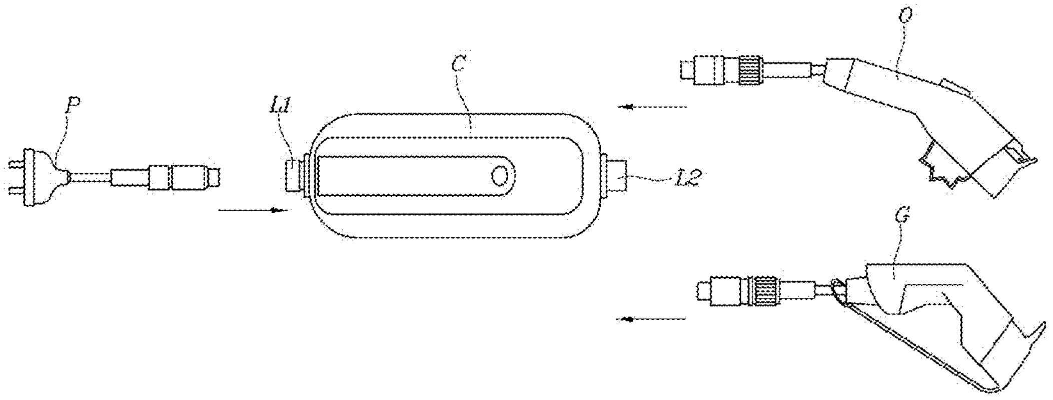

FIGS. 3-6 are views each illustrating a state where the charging apparatuses according to the present disclosure are coupled to each other according to a charging mode. As illustrated in FIGS. 3 and 4, the plurality of charging devices include a plug P, a charging station gun G, and an outlet O. The plug P is connected to an alternating current power source according to Mode 2. The charging station gun G is connected to the alternating current power source according to Mode 3. The outlet O is hooked up to a charging device connected to an electric power source and is connected to an inlet on a vehicle in which a battery to be charged is mounted. The connector C includes a first hook-up unit L1 and a second hook-up unit L2. The first hook-up unit L1 is hooked up to the plug P, and the second hook-up unit L2 is hooked up to the outlet O. Therefore, as illustrated in FIG. 5, there is a need to detect an error in a coupling in order that the charging station gun G and the connector C that are used for different charging systems, respectively, are prevented from being connected to each other. The apparatus for detecting an error in a coupling between charging devices according to the embodiment of the present disclosure, as illustrated in FIG. 6, serves the purpose of determining whether or not the charging device connected to the connector C is the charging station gun G or the outlet O.

Figure 7:
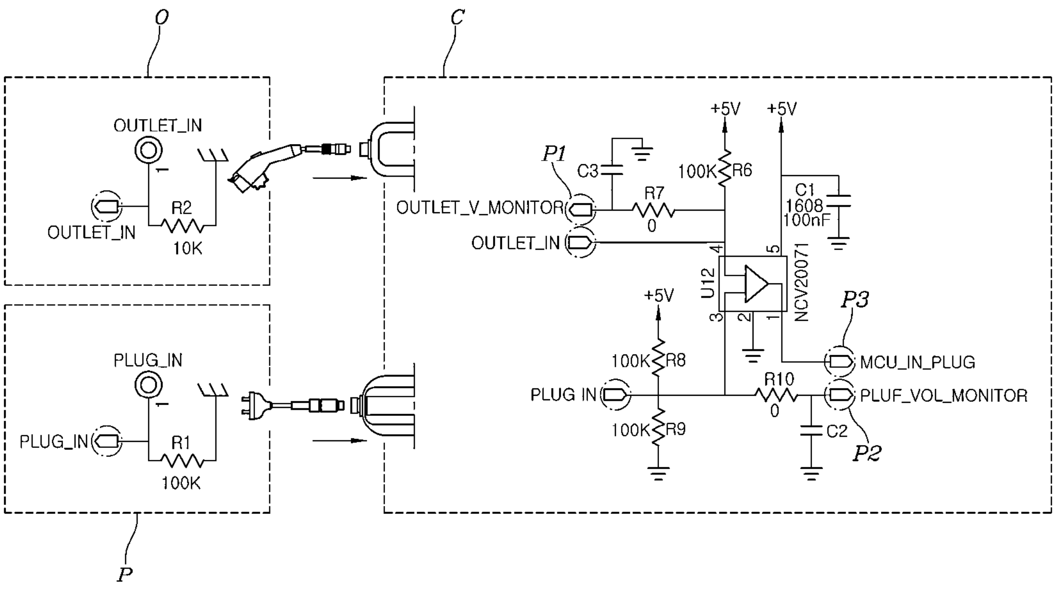
FIG. 7 is a block diagram illustrating a configuration of the apparatus for detecting an error in a coupling between charging devices according to the embodiment of the present disclosure.

FIG. 7 is a block diagram illustrating a configuration of the apparatus for detecting an error in a coupling between charging devices according to the embodiment of the present disclosure. The apparatus for detecting an error in a coupling between charging devices according to the present disclosure may include a voltage generation unit V, a comparison unit A, and a control unit CB. The voltage generation unit V generates voltages that correspond to resistance values, respectively, of a plurality of charging devices that are hooked up to a connector. The comparison unit A compares magnitudes of voltage values of the generated voltages. The control unit CB performs control in such a manner that, among the plurality of charging devices, a charging device preset to be matched based on results of comparing the magnitudes of the voltage values is operated only when hooked up to the connector.

As illustrated in FIG. 7, in the apparatus for detecting an error in a coupling between charging devices according to the embodiment of the present disclosure, a first voltage corresponding to a resistance value of the outlet O may be higher than a second voltage corresponding to a resistance value of the plug P. Furthermore, a third voltage corresponding to a resistance value of the charging station gun G may be higher than the first voltage. In addition, in the apparatus for detecting an error in a coupling between charging devices according to the embodiment of the present disclosure, the resistance value of the outlet O may be within a first resistance section, the resistance value of the plug P may be a resistance value within a second resistance section that is higher than all resistance values within the first resistance section, and the resistance value of the charging station gun G may be a resistance value within a third resistance section that is higher than all resistance values within the second resistance section. Accordingly, it is possible that the error in the coupling is detected using a detection voltage that varies according to the resistance.

Then, the comparison unit A may be a comparator that outputs an output voltage having a non-zero value in a case where a value of a first voltage to be input into a “–” (negative) terminal is lower than a value of a second voltage to be input into a “+” (positive) terminal. The comparison unit A may also be a comparator that outputs an output voltage having a zero value in a case where the value of the first voltage is equal to or higher than the value of the second voltage. The control unit CB may perform control in such a manner that a charging device matched based on the output voltage is operated only when hooked up to the connector. Accordingly, it is possible that the error in the coupling is detected through a voltage difference due to the resistance.

With reference to FIG. 7, under situations where the first hook-up unit L1 and the second hook-up unit L2 are hooked up to the plug P and the outlet O, respectively, examples of voltage configurations at P3 and determination of whether or not the ICCB operates at each of the voltage configurations are summarized as follows. As described below, only in a case where the first hook-up unit L1 and the second hook-up unit L2 are properly hooked up to the plug P and the outlet O, respectively, a 5 V voltage is detected at P3, and thus the ICCB is allowed to properly operate.

In other words, the control unit CP of the above-described apparatus for detecting an error in a coupling between charging devices may control the charging device in such a manner as to be operated and then may control an electric power source based on the control pilot (CP) signal for starting transmission of electric power of the electric power source, interrupting the transmission of the electric power of the electric power source, or controlling an amount of the electric power transmitted from the electric power source. In addition, the CP signal is a pulse width modulation (PWM) signal, and the control unit CB may compute the maximum duty of the CP signal based on a voltage value of a voltage corresponding to the resistance value of the plug P that is connected to the alternating current power source.

Figure 11:
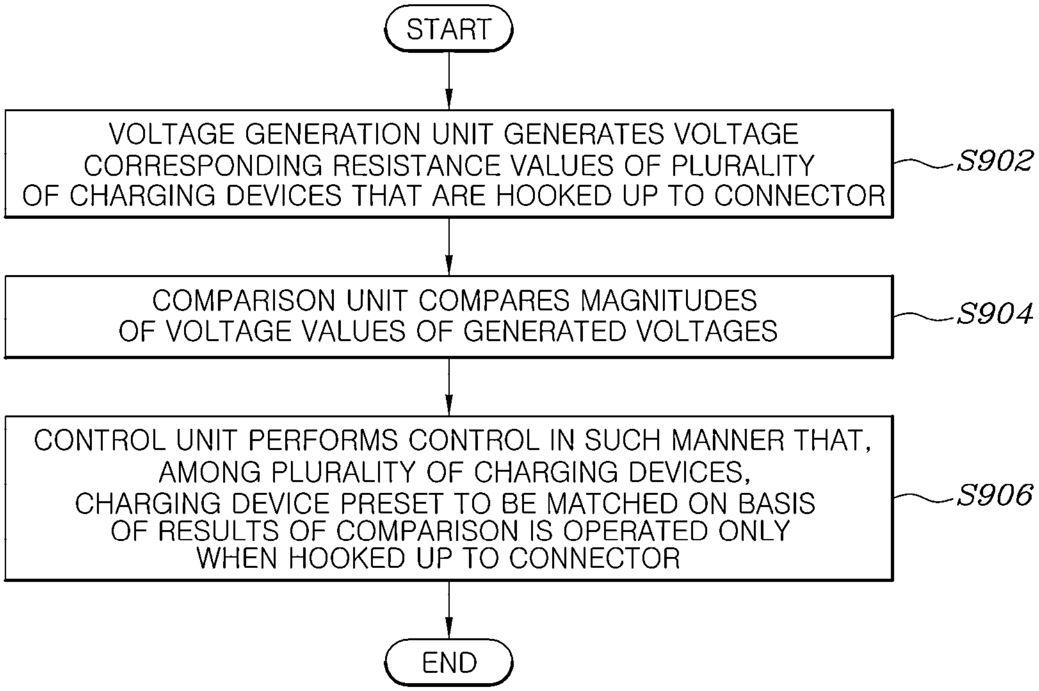
FIG. 11 is a flowchart illustrating a method of detecting an error in a coupling between charging devices according to an embodiment of the present disclosure.

FIG. 11 is a flowchart illustrating a method of detecting an error in a coupling between charging devices according to an embodiment of the present disclosure. The method of detecting an error in a coupling between charging devices according to the present disclosure includes: Step S902 of generating, by a voltage generation unit, voltages that correspond to resistance values, respectively, of a plurality of charging devices that are hooked up to a connector; Step S904 of comparing, by a comparison unit, magnitudes of voltage values of the generated voltages; and Step S906 of performing, by a control unit, control in such a manner that a charging device preset to be matched based on results of the comparison is operated only when hooked up to the connector. A mechanism by which this method is performed and a technical idea of the method are similar to those of the apparatus for detecting an error in a coupling between charging devices according to the embodiment of the present disclosure, as illustrated in FIGS. 1 and 7. Thus, a further description thereof has been omitted.

| Item | Connection to only an outlet | Connection to only a charging station gun | Connection to only a plug | Connections to both an outlet and a plug | Connections to both a charging station gun and a plug | No connection |
|---|---|---|---|---|---|---|
| Magnitudes of voltages at P1 and P2 | Not for connection to electric power (voltage not suitable) | Not for connection to electric power (voltage not suitable) | P1 > P2 | P1 < P2 | P1 > P2 | Not for connection to electric power (voltage not suitable) |
| Connector | Second hook-up unit is connectable | Second hook-up unit is connectable | First hook-up unit is connectable | First and second hook-up units are connectable | First and second hook-up units are connectable | Connector is not connectable |
| Voltage at P3 | 0 V | 0 V | 0 V | 5 V | 0 V | 0 V |
| Operation of ICCB | Not operating | Not operating | Not operating | Operating | Not operating | Not operating |

Figure 8:
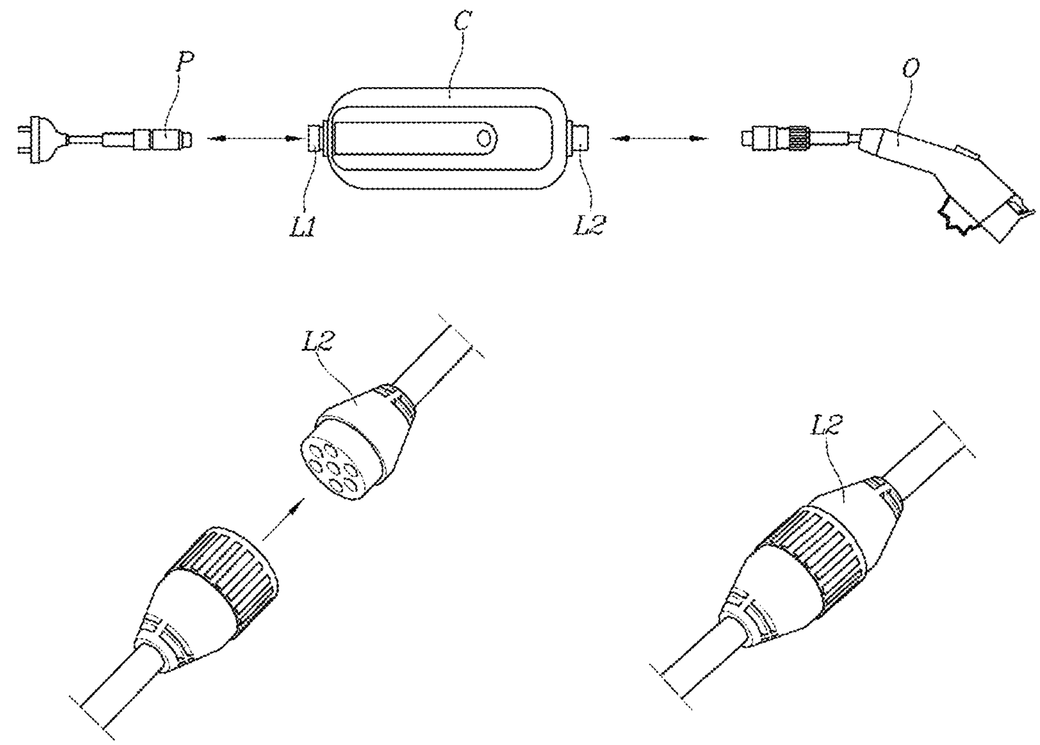
FIG. 8 is a view illustrating the configuration of the apparatus for detecting an error in a coupling between charging devices according to the embodiment of the present disclosure.

FIG. 8 is a view illustrating the apparatus for detecting an error in a coupling between charging devices according to the embodiment of the present disclosure. The first hook-up unit L1 and the second hook-up unit L2 may be coupled to respective charging devices through insertion and rotation.

Figure 9:
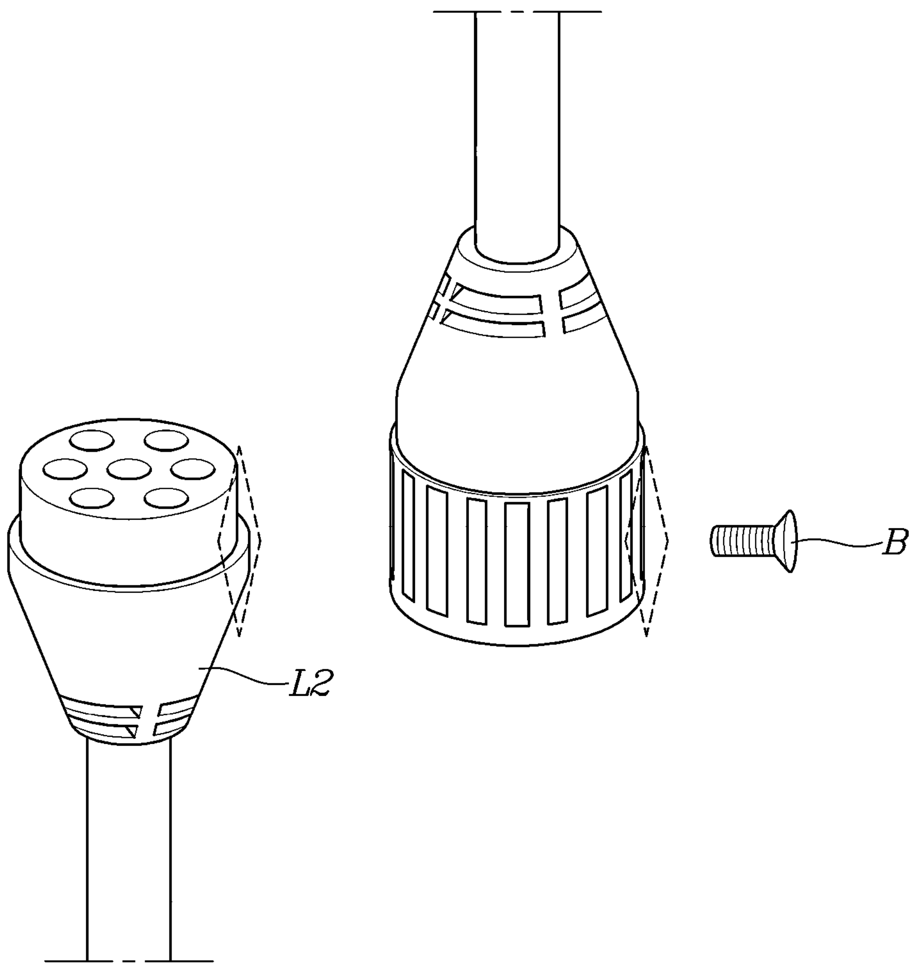
FIG. 9 is a view illustrating the apparatus for detecting an error in a coupling between charging devices according to the embodiment of the present disclosure.

FIG. 9 is a view illustrating the apparatus for detecting an error in a coupling between charging devices according to the embodiment of the present disclosure. Bolts B may be screwed into the first hook-up unit L1 and the charging device and into the second hook-up unit L2 and the charging device, respectively, in such a manner that the first hook-up unit L1 and the second hook-up unit L2 are not separated from the respective charging devices.

Figure 10:
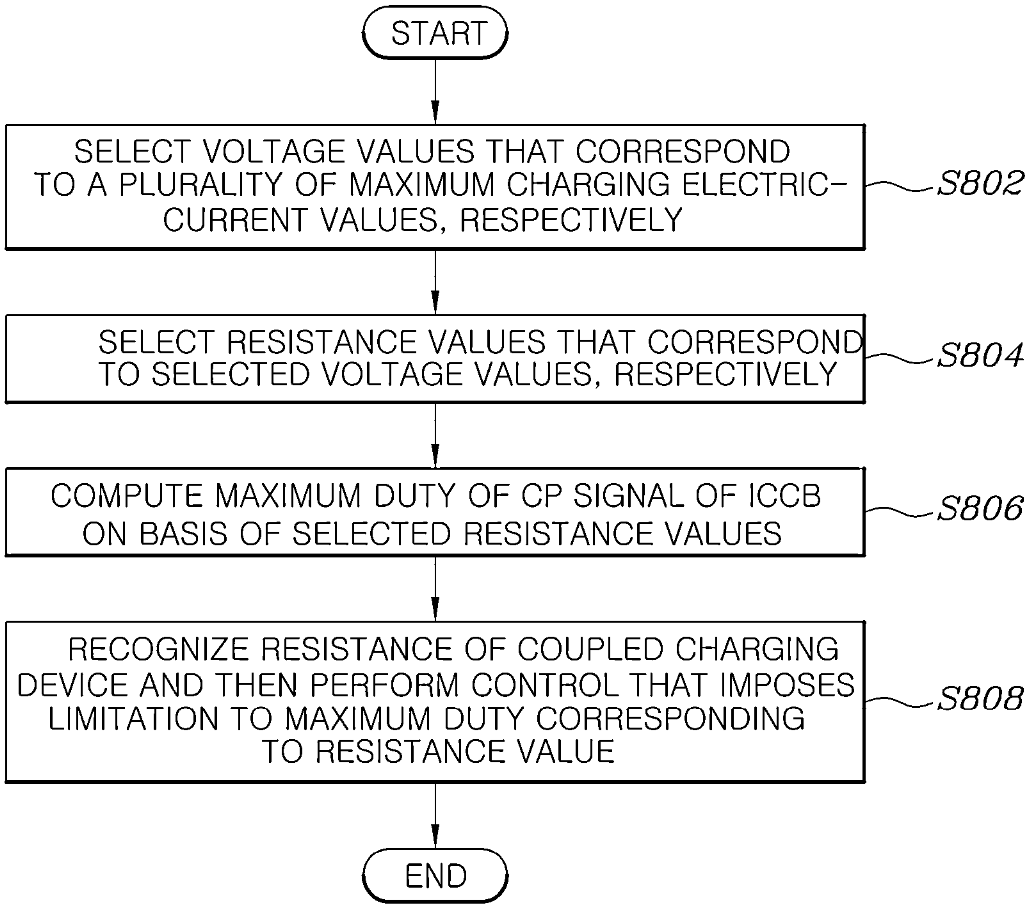
FIG. 10 is a flowchart illustrating a method of detecting an error in a coupling between charging devices according to an embodiment of the present disclosure.

FIG. 10 is a flowchart illustrating a method of detecting an error in a coupling between charging devices according to an embodiment of the present disclosure. The method of detecting an error in a coupling between charging devices according to the embodiment of the present disclosure includes: Step S802 of selecting voltage values that correspond to a plurality of maximum charging electric-current values, respectively; Step S804 of selecting resistance values that correspond to the selected voltage values, respectively; Step S806 of computing a maximum duty of a CP signal of an ICCB based on the selected resistance values; and Step S808 of recognizing resistance of a coupled charging device and then performing control that imposes a limitation to the maximum duty corresponding to the resistance value.

As described above, the specific embodiments of the present disclosure are described with reference to the accompanying drawings. It would be apparent to a person of ordinary skill in the art that various modifications and alterations are possibly made to the present disclosure without departing from the technical idea of the present disclosure that is claimed in the following claims.

DESCRIPTION OF REFERENCE NUMERALS

P: plug
L1: first hook-up unit

L2: second hook-up unit
C: connector
CB: control unit
V: voltage generation unit
A: comparison unit
G: charging station gun
O: outlet
B: bolt
I: insertion unit

What is claimed is:

1. An apparatus for detecting an error in a coupling between charging devices, the apparatus comprising:
   a voltage generation unit generating voltages that correspond to resistance values, respectively, of a plurality of charging devices that are hooked up to a connector;
   a comparison unit comparing magnitudes of voltage values of the generated voltages; and
   a control unit performing control in such a manner that, among the plurality of charging devices, a charging device preset to be matched based on results of comparing the magnitudes of the voltage values is operated only when hooked up to the connector, while operation of other charging devices among the plurality of charging devices is prevented,
   wherein the comparison unit is a comparator configured to receive, at a negative terminal, a first voltage among the generated voltages corresponding to one of the plurality of charging devices, and to receive, at a positive terminal, a second voltage among the generated voltages corresponding to another of the plurality of charging devices, and to compare the first voltage and the second voltage.

2. The apparatus of claim 1, wherein the plurality of charging devices include:
   a plug connected to a first electric power source;
   a charging station gun connected to a second electric power source; and
   an outlet hooked up to the charging device connected to an electric power source, the outlet connected to an inlet on a vehicle in which a battery to be charged is mounted.

3. The apparatus of claim 2, wherein the control unit controls the charging device, such that the control unit controls the electric power source based on a control pilot (CP) signal for starting transmission of electric power of the electric power source, interrupting the transmission of the electric power of the electric power source, or controlling an amount of the electric power transmitted from the electric power source.

4. The apparatus of claim 3, wherein the CP signal is a pulse width modulation (PWM) signal, and the control unit computes a maximum duty of the CP signal based on a voltage value of a voltage corresponding to a resistance value of the plug that is connected to an alternating current power source.

5. The apparatus of claim 2, wherein a first voltage corresponding to a resistance value of the outlet is higher than a second voltage corresponding to a resistance value of the plug, and a third voltage corresponding to a resistance value of the charging station gun is higher than the first voltage.

6. The apparatus of claim 2, wherein a resistance value of the outlet is within a first resistance section, a resistance value of the plug is a resistance value within a second resistance section that is higher than all resistance values within the first resistance section, and a resistance value of the charging station gun is a resistance value within a third resistance section that is higher than all resistance values within the second resistance section.

7. The apparatus of claim 2, wherein the connector comprises:
   a first hook-up unit hooked up to the plug; and
   a second hook-up unit hooked up to the outlet,
   wherein the first hook-up unit and the second hook-up unit are marked with different colors.

8. The apparatus of claim 1, wherein the comparison unit is a comparator that outputs an output voltage having a non-zero value in a case where a value of a first voltage to be input into a negative terminal is lower than a value of a second voltage to be input into a positive terminal and outputs an output voltage having a zero value in a case where the value of the first voltage is equal to or higher than the value of the second voltage.

9. The apparatus of claim 8, wherein the control unit performs control in such a manner that the charging device preset to be matched based on the output voltage is operated only when hooked up to the connector.

10. A method of detecting an error in a coupling between charging devices, the method comprising:
   generating, by a voltage generation unit, voltages that correspond to resistance values, respectively, of a plurality of charging devices that are hooked up to a connector;
   comparing, by a comparison unit, magnitudes of voltage values of the generated voltages; and
   performing, by a control unit, control in such a manner that, among the plurality of charging devices, a charging device preset to be matched based on results of the comparison is operated only when hooked up to the connector, while operation of other charging devices among the plurality of charging devices is prevented,
   wherein the comparison unit is a comparator configured to receive, at a negative terminal, a first voltage among the generated voltages corresponding to one of the plurality of charging devices, and to receive, at a positive terminal, a second voltage among the generated voltages corresponding to another of the plurality of charging devices, and to compare the first voltage and the second voltage.

11. The method of claim 10, wherein in the generating of the voltages, the plurality of charging devices include:
   a plug connected to an alternating current power source;
   a charging station gun; and
   an outlet hooked up to the charging device connected to an electric power source, the outlet connected to an inlet on a vehicle in which a battery to be charged is mounted.

12. The method of claim 11, wherein in the generating of the voltages, a first voltage corresponding to a resistance value of the outlet is higher than a second voltage corresponding to a resistance value of the plug, and a third voltage corresponding to a resistance value of the charging station gun is higher than the first voltage.

13. The method of claim 11, wherein in the generating of the voltages, a resistance value of the outlet is within a first resistance section, a resistance value of the plug is a resistance value within a second resistance section that is higher than all resistance values within the first resistance section, and a resistance value of the charging station gun is a resistance value within a third resistance section that is higher than all resistance values within the second resistance section.

14. The method of claim 11, wherein in the comparing of the magnitudes of the voltage values, the comparison unit outputs an output voltage having a non-zero value in a case where a value of a first voltage to be input into a negative terminal is lower than a value of a second voltage to be input into a positive terminal and outputs an output voltage having a zero value in a case where the value of the first voltage is equal to or higher than the value of the second voltage.

15. The method of claim 14, wherein in the performing of the control, the control unit performs control in such a manner that, among the plurality of charging devices, a charging device matched based on the output voltages is operated only when hooked up to the connector.

* * * * *